(12) United States Patent
Chawla et al.

(10) Patent No.: US 11,360,667 B2
(45) Date of Patent: Jun. 14, 2022

(54) TAGGED MEMORY OPERATED AT LOWER VMIN IN ERROR TOLERANT SYSTEM

(71) Applicants: STMICROELECTRONICS S.r.l., Agrate Brianza (IT); STMicroelectronics International N.V., Geneva (CH)

(72) Inventors: Nitin Chawla, Noida (IN); Giuseppe Desoli, San Fermo Della Battaglia (IT); Anuj Grover, New Delhi (IN); Thomas Boesch, Rovio (CH); Surinder Pal Singh, Noida (IN); Manuj Ayodhyawasi, Noida (IN)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/012,501

(22) Filed: Sep. 4, 2020

(65) Prior Publication Data
US 2021/0072894 A1 Mar. 11, 2021

Related U.S. Application Data
(60) Provisional application No. 62/897,937, filed on Sep. 9, 2019.

(51) Int. Cl.
*G06F 3/06* (2006.01)
*G06N 3/08* (2006.01)

(52) U.S. Cl.
CPC .......... *G06F 3/0604* (2013.01); *G06F 3/0619* (2013.01); *G06F 3/0655* (2013.01); *G06F 3/0679* (2013.01); *G06N 3/08* (2013.01)

(58) Field of Classification Search
CPC .... G06F 3/0604; G06F 3/0619; G06F 3/0655; G06F 3/0679; G06N 3/08
See application file for complete search history.

(56) References Cited

U.S. PATENT DOCUMENTS

| | | |
|---|---|---|
| 5,559,956 A | 9/1996 | Sukegawa |
| 6,205,063 B1 | 3/2001 | Aipperspach et al. |
| 7,647,536 B2 | 1/2010 | Dempsey et al. |
| 8,605,527 B2 | 12/2013 | Shvydun et al. |
| 9,558,107 B2 | 1/2017 | Camp et al. |
| 9,912,352 B1 | 3/2018 | Qin et al. |

(Continued)

OTHER PUBLICATIONS

Azizimazreah, et al., "Tolerating Soft Errors in Deep Learning Accelerators with Reliable On-Chip Memory Designs", *2018 IEEE International Conference on Networking, Architecture and Storage (NAS)*, 2018, pp. 1-10.

(Continued)

*Primary Examiner* — Mark A Giardino, Jr.
(74) *Attorney, Agent, or Firm* — Seed IP Law Group LLP

(57) ABSTRACT

A memory array arranged as a plurality of memory cells. The memory cells are configured to operate at a determined voltage. A memory management circuitry coupled to the plurality of memory cells tags a first set of the plurality of memory cells as low-voltage cells and tags a second set of the plurality of memory cells as high-voltage cells. A power source provides a low voltage to the first set of memory cells and provides a high voltage to the second set of memory cells based on the tags.

26 Claims, 10 Drawing Sheets

(56) References Cited

U.S. PATENT DOCUMENTS

| | | | |
|---|---|---|---|
| 10,622,088 B2 | 4/2020 | Choi | |
| 10,650,902 B2 | 5/2020 | Kannan et al. | |
| 2007/0033449 A1 | 2/2007 | Hwang et al. | |
| 2012/0271982 A1* | 10/2012 | Callaghan | G11C 16/10 711/103 |
| 2014/0095799 A1* | 4/2014 | Fang | G06F 1/3296 711/134 |
| 2015/0128007 A1* | 5/2015 | Kim | G06F 11/1076 714/763 |
| 2016/0225436 A1 | 8/2016 | Wang et al. | |
| 2017/0110194 A1* | 4/2017 | Tiwari | G11C 16/12 |
| 2017/0185478 A1 | 6/2017 | Sakai et al. | |
| 2018/0285732 A1 | 10/2018 | Kurian et al. | |
| 2018/0308561 A1 | 10/2018 | Koker et al. | |
| 2018/0358110 A1 | 12/2018 | Buyuktosunoglu et al. | |
| 2019/0042966 A1 | 2/2019 | Hogaboam et al. | |
| 2019/0056987 A1 | 2/2019 | Busch et al. | |
| 2019/0068220 A1 | 2/2019 | Kumar et al. | |
| 2019/0073259 A1 | 3/2019 | Qin et al. | |
| 2019/0172542 A1 | 6/2019 | Miladinovic | |
| 2019/0294368 A1 | 9/2019 | Hiraishi | |

OTHER PUBLICATIONS

Reagen, et al., "Minerva: Enabling Low-Power, Highly-Accurate Deep Neural Network Accelerators", *2016 ACM/IEEE 43rd Annual International Symposium on Computer Architecture (ISCA)*, 2016, pp. 267-278.

Maliuk, et al., "Analog Neural Network Design for RF Built-In Self-Test", *International Test Conference*, Paper 23.2, 2010, 10 pages.

\* cited by examiner

| | 336a | 336b | 336c | 336d | 336e | 336f | 336g | 336h |
|---|---|---|---|---|---|---|---|---|
| 334 | Low | Low | Low | Low | Low | Low | High | High |
| 332 | K1[a1] | K1[n1] | K1[p1] | K1[x1] | K1[e1] | K1[h1] | C1[q1] | C1[y1] |
| | K1[a2] | K1[n2] | K1[p2] | K1[x2] | K1[e2] | K1[h2] | C1[q2] | C1[y2] |
| | K1[a3] | K1[n3] | K1[p3] | | K1[e3] | K1[h3] | C1[q3] | |
| | K1[a4] | | | | K1[e4] | | | |

*FIG. 3A*

| | 356a | 356b | 356c | 356d | 356e | 356f | 356g | 356h | 358 |
|---|---|---|---|---|---|---|---|---|---|
| 352a | K1[a1] | K1[n1] | K1[p1] | K1[x1] | K1[e1] | K1[h1] | K1[q1] | K1[y1] | Low |
| 352b | K1[a2] | K1[n2] | K1[p2] | K1[x2] | K1[e2] | K1[h2] | K1[q2] | K1[y2] | Low |
| 352c | K1[a3] | K1[n3] | K1[p3] | | K1[e3] | K1[h3] | K1[q3] | | Low |
| 352d | K1[a4] | | | | K1[e4] | | | | Low |
| 352e | | | | | | | | | High |
| 352f | | | | | | | | | High |
| 352g | | | | | | | | | High |
| 352h | | | | | | | | | High |

*FIG. 3C*

TAGGED MEMORY OPERATED AT LOWER VMIN IN ERROR TOLERANT SYSTEM

BACKGROUND

Technical Field

The present disclosure generally relates to a memory array, such as a memory array used in a learning machine (e.g., artificial neural networks (ANN)).

Description of the Related Art

It is known that various computer vision, speech recognition, and signal processing applications benefit from the use of learning machines. Learning machines, as discussed in this disclosure, may fall under the technological titles of machine learning, artificial intelligence, neural networks, probabilistic inference engines, accelerators, and the like. Such machines are arranged to quickly perform hundreds, thousands, and millions of concurrent operations. Conventional learning machines can deliver hundreds of teraflops (one million millions ($10^{12}$) floating-point operations per second) of computing power.

Known computer vision, speech recognition, and signal processing applications benefit from the use of learning machines, such as deep convolutional neural networks (DCNN). A DCNN is a computer-based tool that processes large quantities of data and adaptively "learns" by conflating proximally related features within the data, making broad predictions about the data, and refining the predictions based on reliable conclusions and new conflations. The DCNN is arranged in a plurality of "layers," and different types of predictions are made at each layer.

For example, if a plurality of two-dimensional pictures of faces is provided as input to a DCNN, the DCNN will learn a variety of characteristics of faces such as edges, curves, angles, dots, color contrasts, bright spots, dark spots, etc. These one or more features are learned at one or more first layers of the DCNN. Then, in one or more second layers, the DCNN will learn a variety of recognizable features of faces such as eyes, eyebrows, foreheads, hair, noses, mouths, cheeks, etc.; each of which is distinguishable from all of the other features. That is, the DCNN learns to recognize and distinguish an eye from an eyebrow or any other facial feature. In one or more third and then subsequent layers, the DCNN learns entire faces and higher order characteristics such as race, gender, age, emotional state, etc. The DCNN is even taught in some cases to recognize the specific identity of a person. For example, a random image can be identified as a face, and the face can be recognized as Person_A, Person_B, or some other identity.

In other examples, a DCNN can be provided with a plurality of pictures of animals, and the DCNN can be taught to identify lions, tigers, and bears; a DCNN can be provided with a plurality of pictures of automobiles, and the DCNN can be taught to identify and distinguish different types of vehicles; and many other DCNNs can also be formed. DCNNs can be used to learn word patterns in sentences, to identify music, to analyze individual shopping patterns, to play video games, to create traffic routes, and DCNNs can be used for many other learning-based tasks too.

BRIEF SUMMARY

A system may be summarized as including a plurality of memory cells, which, in operation, store data; memory management circuitry coupled to the plurality of memory cells, wherein the memory management circuitry, in operation, tags a first set of the plurality of memory cells as associated with a first operational mode and tags a second set of the plurality of memory cells as associated with a second operational mode; and power control circuitry, coupled to the memory management circuitry and the plurality of memory cells, wherein the power control circuitry, in operation and based on the tags, provides a first operational voltage to the first set of memory cells and provides a second operational voltage to the second set of memory cells, wherein the first operational voltage is different from the second operational voltage.

The memory management circuitry may identify the first set of memory cells as memory cells that have a statistical probability of errors at the first operational voltage which is below a first threshold level. The first threshold level may correspond to one percent bit cell sense amplifier marginality faults in the plurality of memory cells. The memory management circuitry may identify the second set of memory cells as memory cells that have a statistical probability of errors at the second operational voltage which is below a second threshold level, the second threshold level being lower than the first threshold level. The memory management circuitry, in operation, may tag the first set of memory cells by storing a first value in a first memory associated with the first set of memory cells. The memory management circuitry, in operation, may tag the memory cells by storing a table of memory cell addresses and corresponding tags.

The plurality of memory cells may be arranged as a plurality of rows of cells intersecting a plurality of columns of cells, and wherein the first set of memory cells includes a subset of columns in the plurality of columns of cells. The memory management circuitry, in operation, may tag the first set of memory cells by storing a value in each of the subset of columns. The memory management circuitry, in operation, may tag the first set of memory cells by storing a value in a memory associated with a plurality of the subset of columns.

The plurality of memory cells may be arranged as a plurality of rows of cells intersecting a plurality of columns of cells, and wherein the first set of memory cells includes a subset of rows in the plurality of rows of cells. The memory management circuitry may tag the first set of memory cells by storing a value in each of the subset of rows. The memory management circuitry may tag the first set of memory cells by storing a value in a memory associated with a plurality of the subset of rows.

The power control circuitry may include a low-voltage power supply and a high-voltage power supply. The system may include a voltage selection circuit that, in operation, selects the low-voltage power supply to provide the first operational voltage to the first set of memory cells based on the tag to the first set of memory cells and selects the high-voltage power supply to provide the second operational voltage to the second set of memory cells based on the tag to the second set of memory cells. The memory management circuitry, in operation, may selectively implement error correction coding based on tag values.

A method may be summarized as including tagging a first set of a plurality of memory cells as associated with a first operational mode based on a statistical error rate associated with the first set of memory cells; tagging a second set of the plurality of memory cells as associated with a second operational mode based on a statistical error rate associated with the second set of memory cells; providing a first operational voltage to the first set of memory cells based on the tagging; and providing a second operational voltage to the second set of memory cells based on the tagging, wherein the second voltage is higher than the first voltage.

The method may include providing the first operational voltage to the first set of memory cells for use by at least one first process based on the tagging of the first set of memory cells; and providing the second operational voltage to the second set of memory cells for use by at least one second process based on the tagging of the second set of memory cells. The method may include receiving a request to modify the tagging of the first set of memory cells; tagging a first portion of the first set of memory cells as associated with the first operational mode; and tagging a second portion of the first set of memory cells as associated with the second operational mode. The first set of memory cells may include a larger portion of the plurality of memory cells and the second set of memory cells includes a smaller portion of the plurality of memory cells.

A non-transitory computer-readable medium having contents that cause a processor to perform actions, the actions may be summarized as including determining a first set of a plurality of memory cells as associated with a first operational mode based on a first statistical error rate; storing a first tag associated with the first set of memory cells; determining a second set of the plurality of memory cells as associated with a second operational mode based on a second statistical error rate; storing a second tag associated with the second set of memory cells; selecting a first power source to supply a first operational voltage to the first set of memory cells based on the first tag associated with the first set of memory cells; and selecting a second power source to supply a second operational voltage to the second set of memory cells based on the second tag associated with the second set of memory cells, wherein the first operational voltage is above a minimum threshold and less than the second operational voltage. Selecting the first power source to supply the first operational voltage to the first set of memory cells may include reducing the second operational voltage from the second power source to the first operational voltage.

A system may be summarized as including a plurality of memory cells, which, in operation, store data; memory management circuitry coupled to the plurality of memory cells, wherein the memory management circuitry, in operation, determines an operational voltage for a first set of memory cells of the plurality of memory cells based on an accuracy threshold, wherein the accuracy threshold corresponds to a statistical correlation between operational voltage and operational accuracy of the first set of memory cells; and power control circuitry, coupled to the memory management circuitry and the plurality of memory cells, wherein the power control circuitry, in operation and based on the determined operational voltage, provides the determined operational voltage to the first set of memory cells.

The operational accuracy of the first set of memory cells may be based on a system operational accuracy of operations performed using the data stored in at least the first set of memory cells. The operational accuracy of the first set of memory cells may be based on a statistical accuracy for a number of sense amplifier marginality faults in the first set of memory cells. The memory management circuitry, in operation, may determine the operational voltage for the first set of memory cells based on the operational accuracy being selected by a user. Power control circuitry, in operation, may provide a second operational voltage to a second set of memory cells of the plurality of memory cells, wherein the determined operational voltage is different from the second operational voltage. The memory management circuitry, in operation, may tag the first set of memory cells to be associated with the determined operational voltage by storing a first value in a first memory associated with the first set of memory cells.

The memory management circuitry, in operation, may tag the first set of the plurality of memory cells as associated with a first operational mode and tags a second set of the plurality of memory cells as associated with a second operational mode; and wherein the power control circuitry, in operation and based on the tags, provides a first operational voltage to the first set of memory cells and provides a second operational voltage to the second set of memory cells, wherein the first operational voltage is different from the second operational voltage. The power control circuitry may include a low-voltage power supply and a high-voltage power supply. The system may include a voltage selection circuit that, in operation, selects the low-voltage power supply to provide the first operational voltage to the first set of memory cells based on the tag to the first set of memory cells and selects the high-voltage power supply to provide the second operational voltage to the second set of memory cells based on the tag to the second set of memory cells.

A method may be summarized as including initiating performance of a process using a plurality of memory cells to store data at a first operational voltage that corresponds to a first operational accuracy of the process; detecting an event associated with the process; and in response to detection of the event, modifying the performance of the process to correspond to a second operational accuracy that is higher than the first operational accuracy. Modifying the performance of the process may include providing, to the plurality of memory cells, a second operational voltage that is higher than the first operational voltage. Modifying the performance of the process may include initiating performance of the process using a second plurality of memory cells to store data at second first operational voltage that corresponds to the second first operational accuracy of the process. Second operational voltage may be higher than the first operational voltage. Modifying the performance of the process may include initiating performance of a second process using the plurality of memory cells to store data at the first operational accuracy.

A method may be summarized as including determining a first operational accuracy of a first plurality of memory cells, which, in operation, store data; determining a second operational accuracy of a second plurality of memory cells, which, in operation, store data, wherein the second operational accuracy is higher than the first operation accuracy; receiving a request to perform computing operations; determining an operation type of the computing operations to be performed; in response to a first determined operation type, performing the computing operations using the first plurality of memory cells; and in response to a second determined operation type, performing the computing operations using the second plurality of memory cells. Performing the computing operations using the first plurality of memory cells may include providing a first operational voltage to the first plurality of memory cells that is lower than a second operational voltage provided to the second plurality of memory cells. Performing the computing operations using the second plurality of memory cells may include providing a first operational voltage to the second plurality of memory cells that is higher than a second operational voltage provided to the first plurality of memory cells.

The method may further include wherein receiving the request to perform the computing operations includes, receiving a first request to perform first computing operations of the first determined operation type; performing the first computing operations using the first plurality of memory cells at a first operational voltage; receiving a second request to perform second computing operations of the second determined operation type based on a result of the performance of the first computing operations; and performing the second computing operations using the second plurality of memory cells at a second operational voltage that is higher than the first operational voltage. Determining the operation type of the computing operations to be performed may include identifying an acceptable operational accuracy of a result of performing the computing operations; in response to the acceptable operational accuracy being below a threshold value, selecting the first determined operational type to use the first plurality of memory cells at a first operational voltage; and in response to the acceptable operational accuracy being above the threshold value, selecting the second determined operational type to use the second plurality of memory cells at a second operational voltage that is greater than the first operational voltage.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Moreover, some elements known to those of skill in the art have not been illustrated in the drawings for ease of illustration. One or more embodiments are described hereinafter with reference to the accompanying drawings in which:

FIGS. 3A-3D illustrate additional use-case context diagrams of memory arrays with tagged memory cells for low-voltage and high-voltage memory cells;

DETAILED DESCRIPTION

Figure 1:
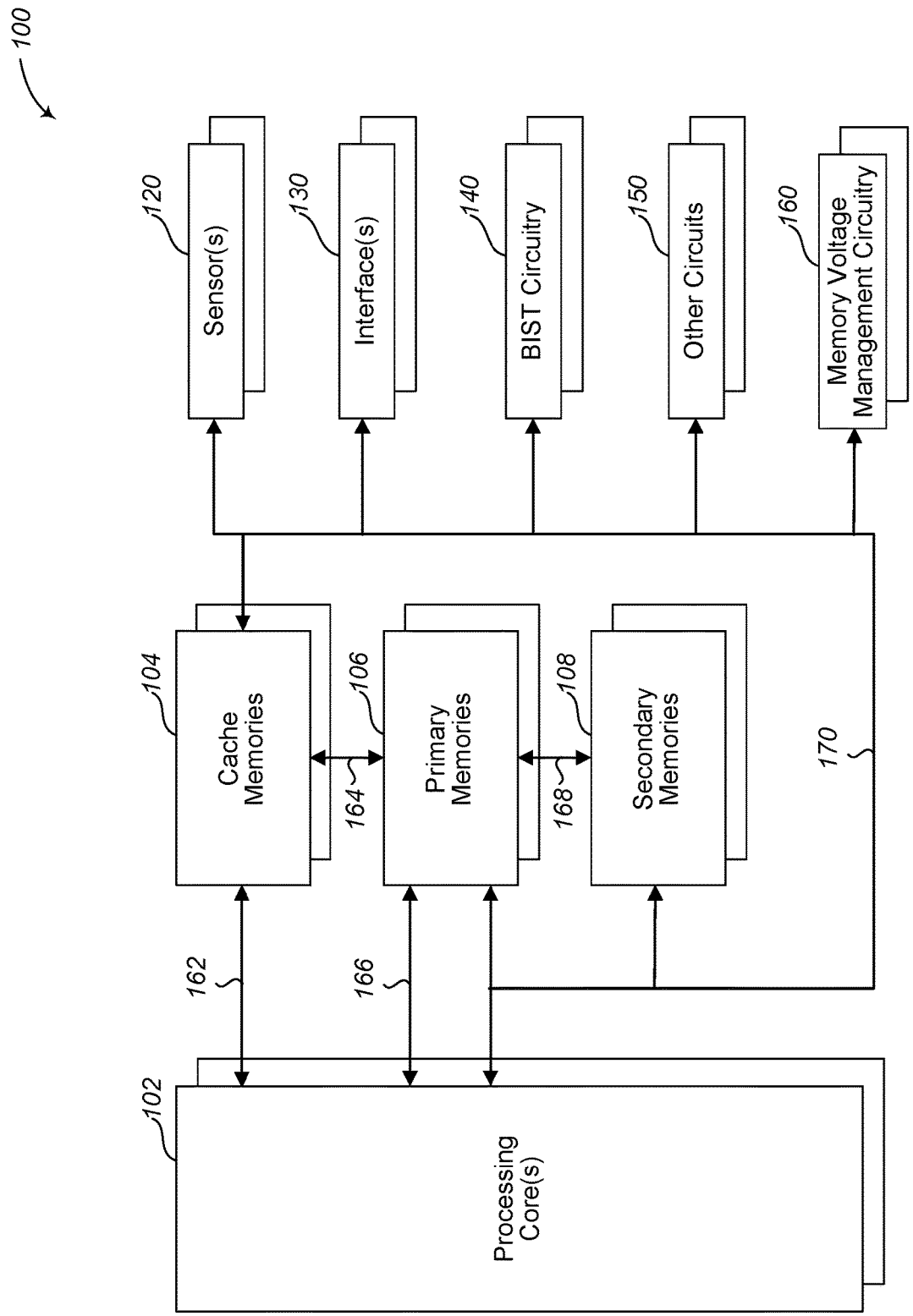
FIG. 1 is a functional block diagram of an embodiment of an electronic device or system having a processing core and a memory according to an embodiment.

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to interfaces, power supplies, physical component layout, etc. in an in-compute memory environment, have not been shown or described in order to avoid unnecessarily obscuring descriptions of the embodiments. Additionally, the various embodiments may be methods, systems, or devices.

Throughout the specification, claims, and drawings, the following terms take the meaning associated herein, unless the context indicates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context indicates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context indicates otherwise. In addition, throughout the specification, the meaning of "a," "an," and "the" include singular and plural references.

The computations performed by a DCNN, or by other neural networks, often include repetitive computations over large amounts of data. For example, many learning machines compare known information, or kernels, with unknown data, or feature vectors, such as comparing known pixel groupings with a portion of an image. One type of common comparisons are dot products between the kernels and the feature vectors. However, kernel size, feature size, and depth tend to vary across different layers of the neural network. In some instances, dedicated computation units may be used to enable these operations over varying data sets.

Moreover, memory arrays in integrated circuits may contain manufacturing defects, which may render one or more cells of a memory array statistically incapable of accurately storing data. In addition, memory cells of a memory array may fail over time. For this reason, memory arrays may contain spare cells in redundant rows or columns, or both, which can be used to replace a failed row or column of the memory array.

An integrated circuit may be tested as part of the manufacturing process or periodically after the manufacturing process to identify failed rows and columns of memory arrays of the integrated circuit. For example, probe-testing, built-in-self-testing (BIST), etc., circuitry and testing routines may be employed. Failed rows or columns or both may be identified using thresholds (e.g., a number of failed cells in a row or column exceeding a threshold number), statistical analysis (e.g., a likelihood that error correction techniques, such as error-correction coding, will fail to correct errors in a row or column exceeding a threshold likelihood), etc., and various combinations thereof.

For example, various data patterns may be loaded into and read from the memory array, and the data read from the memory array may be analyzed to identify incorrect bit values. The information related to the occurrences of incorrect bit values can be used to identify, based on statistical analysis, failed rows and columns in a memory array.

If a row or column is identified as unusable, the memory array may be repaired by using one of the spare rows or columns to replace the failed row or column. Information identifying failed rows or columns is stored so that those rows and columns are not used to store data. When the number of failed rows or columns is too high (e.g., exceeds a threshold number or statistical chip failure probability), the integrated circuit including the memory array is determined to be unsuitable because it has too many non-repairable faults, and either discarded or possibly entirely repurposed (e.g., an integrated circuit designed to have a 6 MB memory array may be repurposed as a 4 MB memory array).

FIG. 1 is a functional block diagram of an embodiment of an electronic device or system 100 of the type to which the embodiments, which will be described, may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. As illustrated, the system 100 includes one or more cache memories 104, one or more primary memories 106, and one or more secondary memories 108. One or more of the memories 104, 106, 108 includes a memory array (see, e.g., memory array 202 of FIGS. 2A-2B and memory arrays 330, 340, 350, and 360 in FIGS. 3A-3D, respectively), which, in operation, is shared by one or more processes executed by the system 100.

The system 100 may include one or more sensors 120 (e.g., image sensors, audio sensors, accelerometers, pressure sensors, temperature sensors, etc.), one or more interfaces 130 (e.g., wireless communication interfaces, wired communication interfaces, etc.), one or more BIST circuits 140, and other circuits 150, which may include antennas, power supplies, etc., and a main bus system 170. The main bus system 170 may include one or more data, address, power, and/or control buses coupled to the various components of the system 100. The system 100 also may include additional bus systems such as bus system 162, which communicatively couples the cache memory 104 and the processing core 102, bus system 164, which communicatively couples the cache memory 104 and the primary memory 106, bus system 166, which communicatively couples the primary memory 106 and the processing core 102, and bus system 168, which communicatively couples the primary memory 106 and the secondary memory 108.

The primary memory or memories 106 are typically the working memory of the system 100 (e.g., the memory or memories upon which the processing cores 102 work), and may typically be a volatile memory of a limited size storing code and data related to processes executed by the system 100. For convenience, reference herein to data stored in a memory may also refer to code stored in a memory. The secondary memory 108 may typically be a non-volatile memory, which stores instructions and data, which may be retrieved and stored in the primary memory 106 when needed by the system 100. The cache memory 104 may be a relatively fast memory compared to the secondary memory 108 and typically has a limited size, which may be larger than a size of the primary memory 106.

The cache memory 104 temporarily stores code and data for later use by the system 100. Instead of retrieving needed code or data from the secondary memory 108 for storage in the primary memory 106, the system 100 may check the cache memory 104 first to see if the data or code is already stored in the cache memory 104. A cache memory 104 may significantly improve performance of a system, such as the system 100, by reducing the time and other resources needed to retrieve data and code for use by the system 100. When code and data are retrieved (e.g., from the secondary memory 108) for use by the system 100, or when data or code are written (e.g., to the primary memory 106 or to the secondary memory 108), a copy of the data or code may be stored in the cache memory 104 for later use by the system 100. Various cache management routines may be employed to control the data stored in the cache memory or memories 104.

The system 100 also includes memory voltage management circuitry 160, which, in operation, employs one or more memory management routines to employ a first portion of the memory 104, 106, or 108 in a low-voltage mode and a second portion of the memory 104, 106, or 108 in a high-voltage mode. In various embodiments, the memory voltage management circuitry 160 tags or otherwise stores one or more indicators of which memory cells are operated in low-voltage mode and which memory cells are operated in a high-voltage mode. The memory voltage management circuitry 160 may, alone or in combination with other processing circuitry (e.g., by processing cores 102), execute routines and functionality described herein, including processes 400 and 500 in FIGS. 4 and 5, respectively. The memory voltage management circuitry 160 may be one or more processors, a state machine, a microprocessor, a programmable logic circuit, discrete circuitry, logic gates, registers, etc., and various combinations thereof.

Utilization of the phrases "low voltage" or operating in "low-voltage mode" refers to voltage supplied to a memory cell that is less than the voltage supplied to a memory cell supplied with a "high voltage" or operating in a "high-voltage mode." Memory cells that operate in low-voltage mode may be, for example, memory cells that are associated with an executing process that is relatively more tolerant to an identified statistical number of errors resulting from bit cell sense amplifier marginality faults. Conversely, memory cells that operate in high-voltage mode may be memory cells that are associated with a process that is relatively less tolerant of bit cell sense amplifier marginality faults. Low-voltage operational mode may be defined by a first selected or determined fault tolerant number of errors, and high-voltage operational mode may be defined by a second selected or determined fault tolerant number of errors. For example, with respect to memory cells operating in low-voltage mode, the voltage is maintained at a first, lower level that statistically results in up to 1% errors in the values stored in or read from the low-voltage memory cells. Conversely, with respect to memory cells operating in high-voltage mode, the voltage is maintained at a second, higher level that statistically results in less than 0.01% errors in the values stored or read from the high-voltage memory cells. In some embodiments, low-voltage mode may also be referred as "low-power mode" and high-voltage mode may also be referred to as "high-power mode."

In various embodiments, low-voltage memory cells may include those memory cells that store kernel data, intermediate partial sums, or feature data associated with the learning or application of an artificial neural network system. In general, the data stored by the low-voltage memory cells may be data that is processed with errors or outliner data being removed. For example, during the learning process, a few blurry pixels or a dead pixel in one image will be filtered out during the learning process with other images. Thus, an error in a memory cell due to low voltage would be similarly treated and removed. Conversely, high-voltage memory cells may include those memory cells that store configuration or layer sequence data with the learning or application of an artificial neural network system. For example, the data stored by the high-voltage memory cells may be data that may be static, used as base comparison information, or information to configure one or more layers of processing, information which is not further processed for error removal, host system processes, etc.

Embodiments of the system 100 may have more components than illustrated in FIG. 1, may have fewer components than illustrated in FIG. 1, may combine the functionality of components in various manners, may split the functionality of components in various manners, etc., and various combinations thereof. For example, in some embodiments the secondary memories may include memories external to the system 100, in addition to or instead of the illustrated secondary memory 108; in some embodiments multiple layers of cache memory may be employed; etc.

Figure 2A:
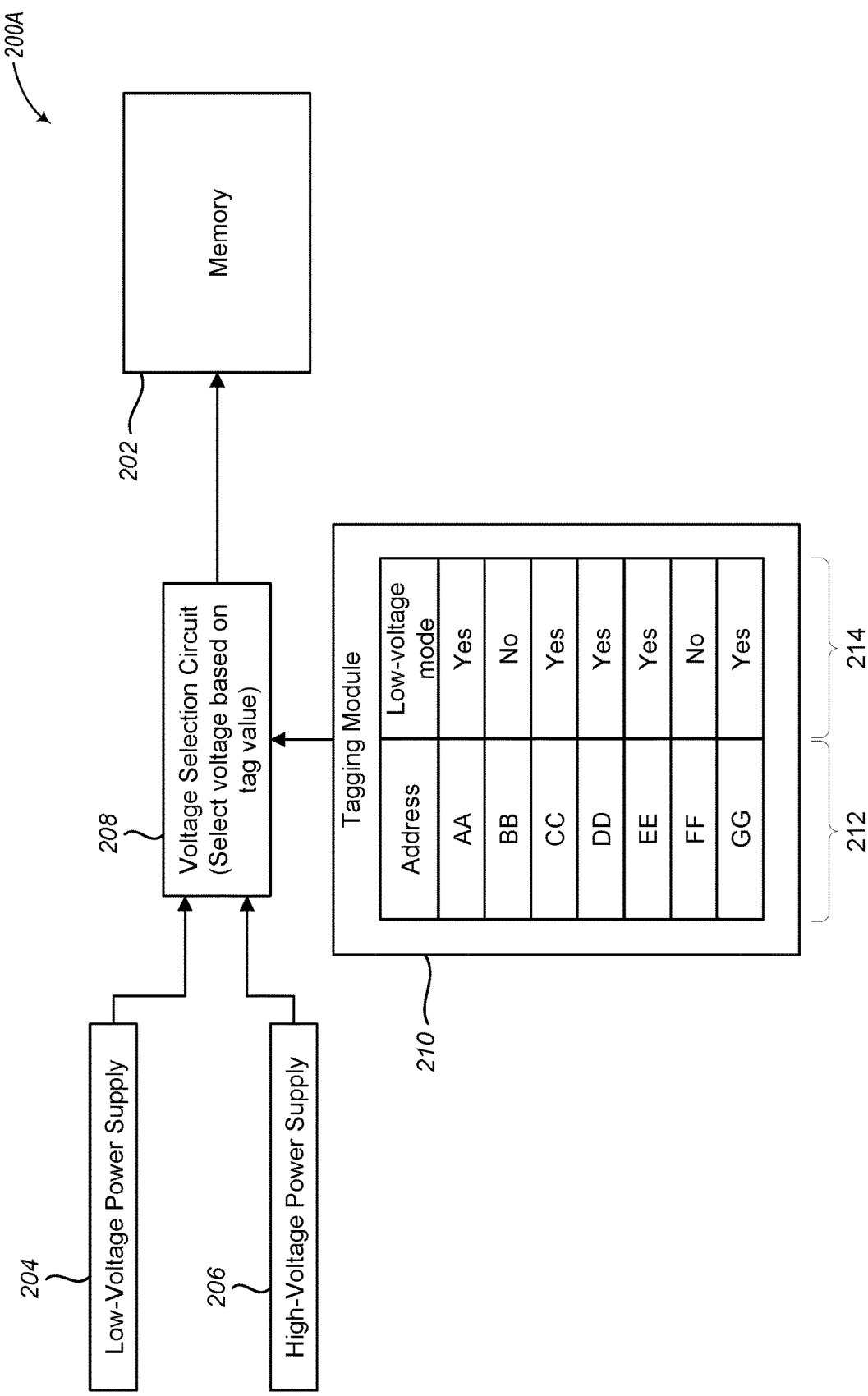
FIGS. 2A-2B illustrate use-case context diagrams of memory arrays with tagged memory cells for low-voltage and high-voltage memory cells.
Figure 2B:
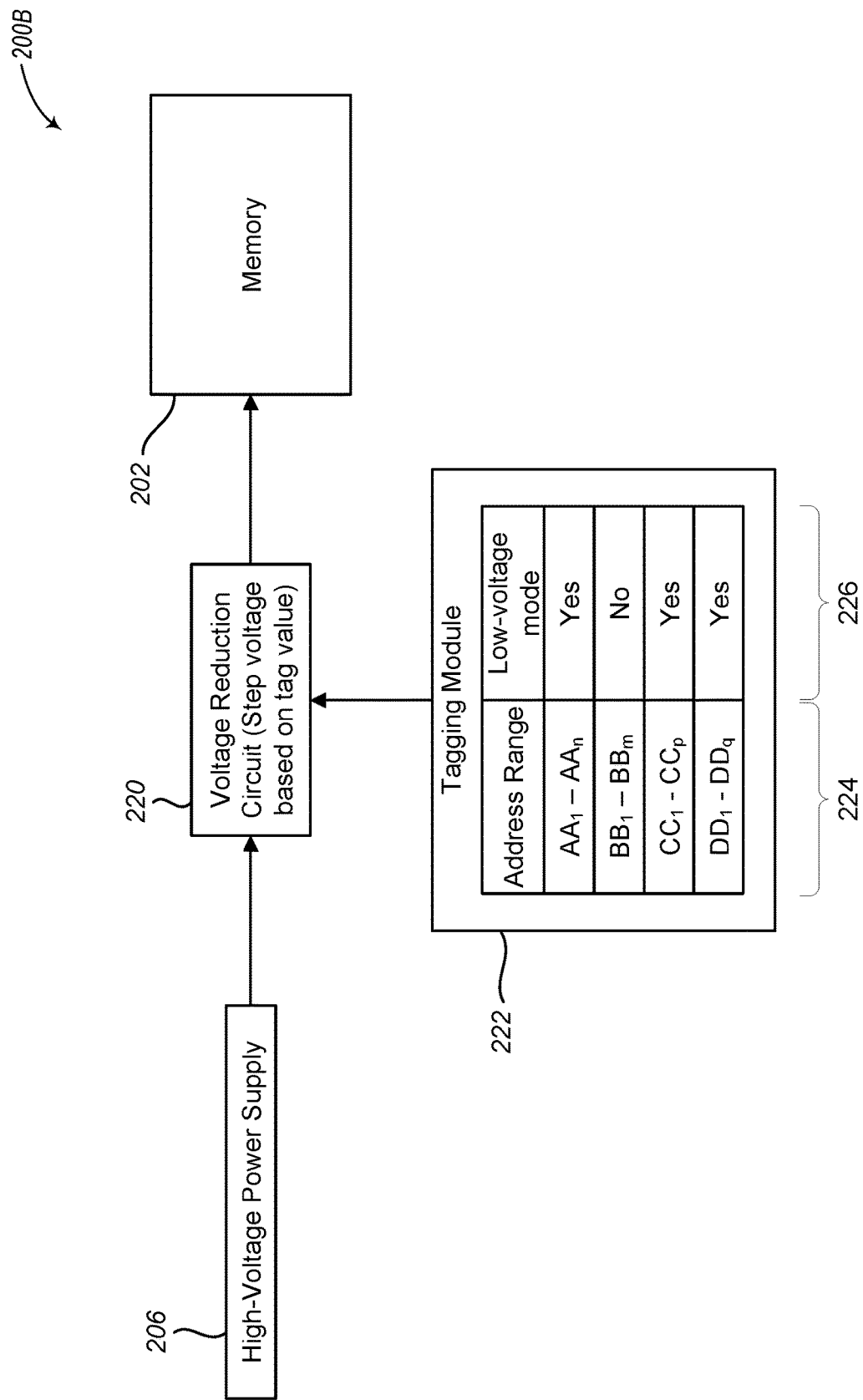

FIGS. 2A-2B illustrate use-case context diagrams of memory arrays with tagged memory cells for low-voltage and high-voltage memory cells. System 200A in FIG. 2A includes a memory array 202, a voltage selection circuit 208, and a tagging module 210. The system 200 also includes a low-voltage power supply 204 and a high-voltage power supply 206. The low-voltage power supply 204 is configured to, in operation, provide power to memory cells of memory array 202 at a first, low voltage, and the high-voltage power supply 206 is configured to, in operation, provide power to memory cells of memory array 202 at a section, high voltage. The power supplied by the low-voltage power supply is at a lower voltage than the power supplied by the high-voltage power supply.

The memory array 202 includes a plurality of cells configured in a column-row arrangement with a plurality of rows of cells intersecting a plurality of columns of cells. Each cell may be addressable via a particular column and a particular row. The number of cells in the memory array 202 may vary depending on the implementation, utilization, and system. Details of the functionality and components of each memory cell, as well as for accessing particular memory cells, are known to those skilled in the art and not described herein for conciseness.

The tagging module 210 stores data that identifies which memory cells in memory array 202 are tagged to be operated in low-voltage mode and which memory cells in memory array 202 are tagged to be operated in high-voltage mode. In some embodiments, the tagging module 210 may be a memory or database or have access to a memory or database that stores such tagging information. In the illustrated embodiment, the tagging module 210 may store a mapping between memory addresses 212 of memory cells in memory array 202 and the tags 214. In this example, the tags 214 may include the value "yes" indicating that the correspondingly mapped address 212 is in low-voltage mode or "no" indicating that the correspondingly mapped address 212 is in high-voltage mode. The "yes" and "no" values may be represented in the tagging module 210 by storing "1" and "0" or other such information. Although the tagging module 210 illustrates the mapping between single memory addresses 212 and corresponding tags 214, embodiments are not so limited. For example, the memory addresses may be ranges or groups of memory addresses, such as illustrated in FIG. 2B.

The voltage selection circuit 208 is configured to, in operation, select the appropriate voltage to deliver to the memory cells in memory array 202 based on the mappings stored by the tagging module 210. The voltage selection circuit 208 selects the low-voltage power supply 204 to provide power to those memory cells tagged as low voltage and selects the high-voltage power supply 206 to provide power to those memory cells tagged as high voltage. In some embodiments, the voltage selection circuit 208 may be employed by, a component of, or an example embodiment of the memory voltage management circuitry 160 in FIG. 1.

System 200B in FIG. 2B is similar to system 200A in FIG. 2A in that includes a memory array 202 and a tagging module 222. In this example, however, the tagging module 222 stores data that identifies which groups of memory cells in the memory array 202 are tagged to be operated in low-voltage mode and which groups memory cells in the memory array 202 are tagged to be operated in high-voltage mode. In the illustrated embodiment, the tagging module 222 stores a mapping between memory address ranges 224 of memory cells in the memory array 202 and tags 226. The tags 226 may include the value "yes" indicating that the correspondingly mapped address range 224 is in low-voltage mode or "no" indicating that the correspondingly mapped address range 224 is in high-voltage mode. In this example, each memory cell having an address within a particular memory address range 224 inherits the corresponding tag 226 value for that range 224.

Similar to tagging module 212 in FIG. 2A, tagging module 222 may be a memory or database or have access to a memory or database that stores such tagging information. Likewise, the tag values of "yes" and "no" may be represented in the tagging module 222 by storing "1" and "0" or other such information. Although the tagging module 222 illustrates the mapping between multiple memory addresses or regions 224 and a corresponding tag 226, embodiments are not so limited. For example, the memory addresses may be single memory addresses, such as illustrated in FIG. 2A.

As described above in FIG. 2A, a voltage selection circuit may be utilized to select between a low-voltage and a high-voltage power supply. System 200B in FIG. 2B, alternatively, instead includes a high-voltage power supply 206 and a voltage reduction circuit 220. The voltage reduction circuit 220 is configured to, in operation, identify which memory cells in memory array 202 are to be operated in low-voltage mode and which memory cells in memory array 202 are to be operated in high-voltage mode based on the mappings stored by the tagging module 222. The voltage selection circuit 220 provides the high voltage supplied by the high-voltage power supply 206 to the high-voltage mode memory cells and reduces the voltage supplied by the high-voltage power supply 206 to provide power to the low-power memory cells. In some embodiments, the voltage reduction circuit 220 may utilize circuitry to step the high voltage down to a determined low voltage value. In some embodiments, the voltage reduction circuit 220 may be employed by, a component of, or an example embodiment of the memory voltage management circuitry 160 in FIG. 1.

FIGS. 3A-3D illustrate additional use-case context diagrams of memory arrays with tagged memory cells for low-voltage and high-voltage memory cells.

Example 300A in FIG. 3A includes a memory 330. The memory 330 is configured in a plurality of rows 332 and a plurality of columns 336a-336h (collectively 336). In this example, the memory 330 also includes a row 334 for storing tag values for the respective columns 336a-336h. For example, columns 336a-336f have stored in corresponding row 334 "low" values to indicate that the memory cells in columns 336a-336f are operated in low-voltage mode, and columns 336g-336h have stored in corresponding row 334 "high" values to indicate that the memory cells in columns 336g-336h are operated in high-voltage mode. In some embodiments, the memory 330 may include additional circuitry that provides selection functionality or reduction functionality similar to voltage selection circuit 208 in FIG. 2A or voltage reduction circuit 220 in FIG. 2B based on the stored values in row 334.

Figure 3B:
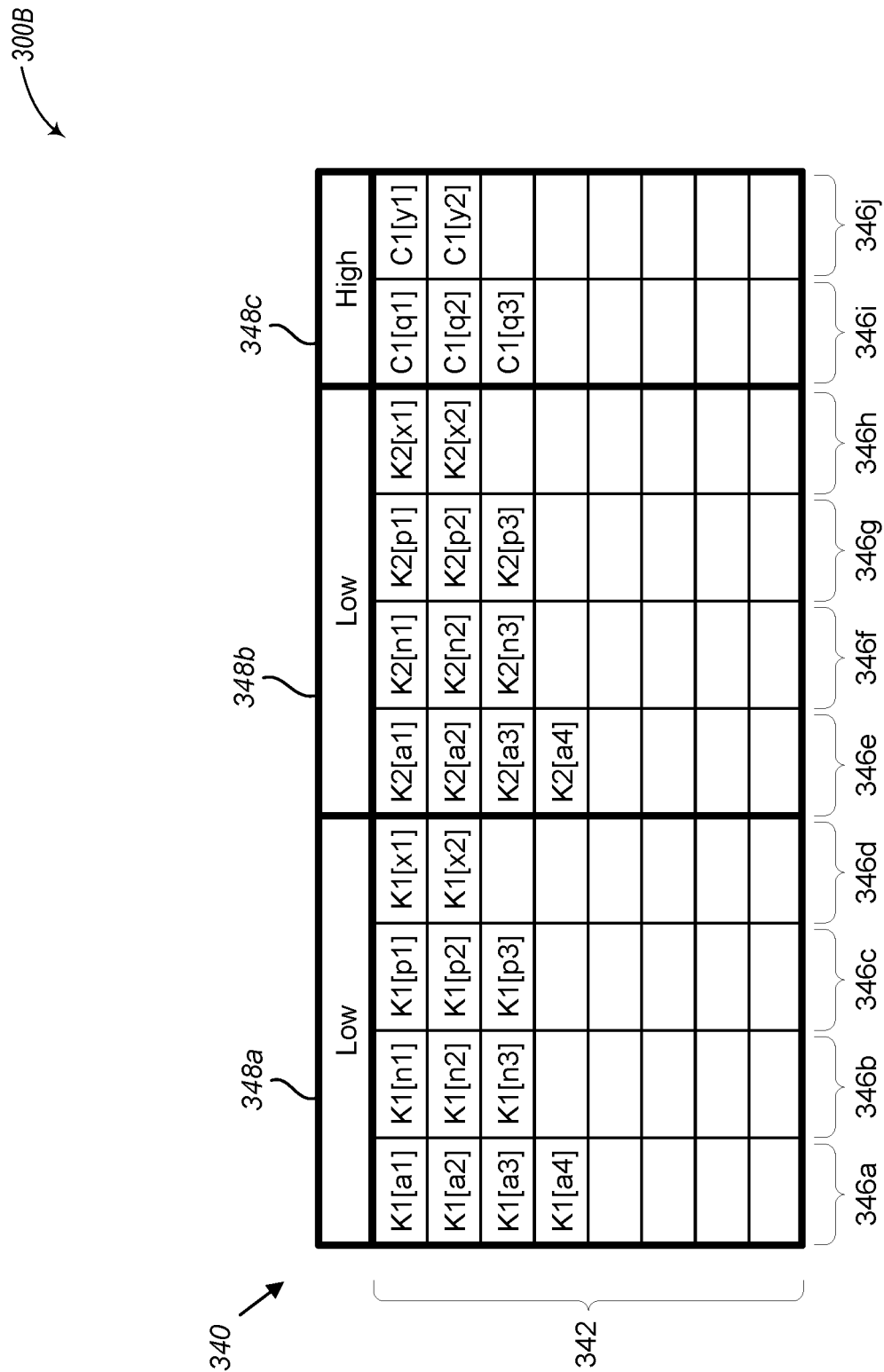

Example 300B in FIG. 3B is similar to example 300A in FIG. 3A, but where multiple columns are tagged together. Example 300B includes a memory 340. The memory 340 is configured in a plurality of rows 342 and a plurality of columns 346a-346j (collectively 346). In this example, the memory 340 also includes tag circuitry 348a-348c (collectively 348) for storing tag values for one or more columns 346a-336j. For example, tag circuitry 348a has stored in therein a "low" value to indicate that the memory cells in columns 346a-346d are operated in low-voltage mode, tag circuitry 348b has stored in therein a "low" value to indicate that the memory cells in columns 346e-346h are operated in low-voltage mode, and tag circuitry 348c has stored in therein a "high" value to indicate that the memory cells in columns 346i-346j are operated in high-voltage mode. In some embodiments, the memory 340 may include additional circuitry that provides selection functionality or reduction functionality similar to voltage selection circuit 208 in FIG. 2A or voltage reduction circuit 220 in FIG. 2B based on the stored values in row 334.

Example 300C in FIG. 3C is similar to example 300A in FIG. 3A, but where rows of memory cells are tagged. Example 300C in FIG. 3C includes a memory 350. The memory 350 is configured in a plurality of rows 352a-352h (collectively 352) and a plurality of columns 356a-356h (collectively 356). In this example, the memory 350 also includes a column 358 for storing tag values for the respective rows 352a-352h. For example, rows 352a-352d have stored in corresponding column 358 "low" values to indicate that the memory cells in rows 352a-352d are operated in low-voltage mode, and rows 352e-352h have stored in corresponding column 358 "high" values to indicate that the memory cells in rows 352e-352h are operated in high-voltage mode. In some embodiments, the memory 350 may include additional circuitry that provides selection functionality or reduction functionality similar to voltage selection circuit 208 in FIG. 2A or voltage reduction circuit 220 in FIG. 2B based on the stored values in row 334.

Figure 3D:
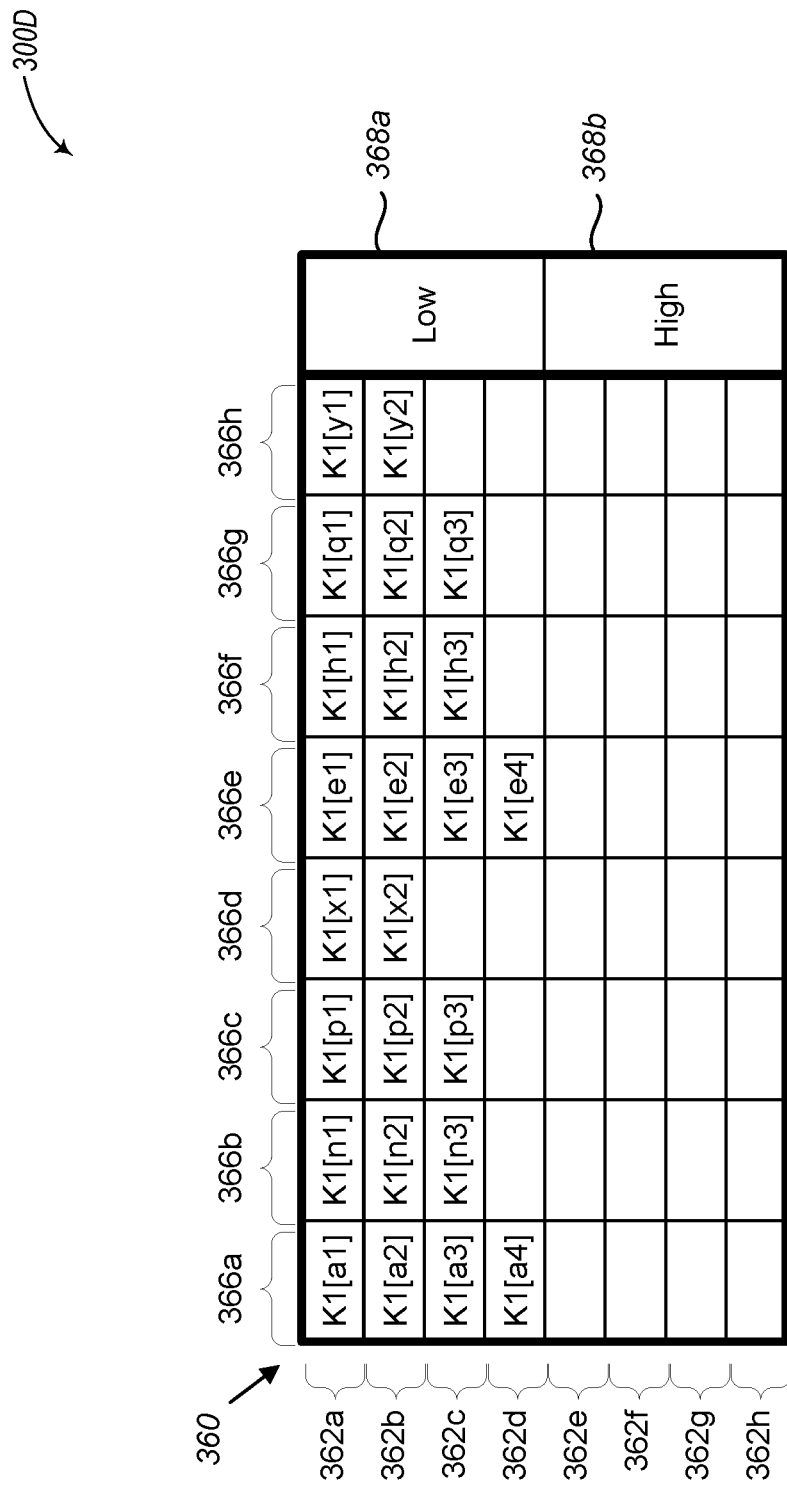

Example 300D in FIG. 3D is similar to example 300C in FIG. 3C, but where multiple rows are tagged together. Example 300D includes a memory 360. The memory 360 is configured in a plurality of rows 362a-262h (collectively 362) and a plurality of columns 366a-366h (collectively 366). In this example, the memory 360 also includes tag circuitry 368a-368b (collectively 368) for storing tag values for one or more rows 362a-362h. For example, tag circuitry 368a has stored in therein a "low" value to indicate that the memory cells in rows 362a-362d are operated in low-voltage mode and tag circuitry 368b has stored in therein a "high" value to indicate that the memory cells in rows 362e-362h are operated in high-voltage mode. In some embodiments, the memory 360 may include additional circuitry that provides selection functionality or reduction functionality similar to voltage selection circuit 208 in FIG. 2A or voltage reduction circuit 220 in FIG. 2B based on the stored values in row 334.

Although FIGS. 2A-2B and 3A-3D describe the memory tagging at the memory or circuit level, embodiments are not so limited. In other embodiments, software may be utilized to tag and manage the tagging of memory cells based on their addresses using similar functionality as described herein.

Moreover, although the above-described examples discuss dynamically tagging specific memory cells or groups of memory cells as low voltage or high voltage, embodiments are not so limited. For example, in some embodiments, the system may include two memory arrays, where one memory array is operated with low voltage and the other memory array is operated with high voltage. In this type of system, there are no tags—rather, the voltage supplied to the memory arrays is static such that one memory array operates at a lower voltage than the other. Both of these memory arrays may be part of a same memory array or they may be physically distinct. The low voltage memory array may have a designated low-voltage power supply that is separate from a high-voltage power supply that provides power to the high voltage memory array. Alternatively, the low voltage memory array may include or be associated with additional circuitry that steps down or reduces the voltage provided by the high-voltage power supply. In various embodiments, the memory arrays may operate under the same operating parameters, but are supplied with different voltages. In this way, the low-voltage memory cells may experience more errors than the high-voltage memory cells. Because the data stored by the low-voltage memory cells is tolerant of more errors, it can be stored using less voltage, which increases the power saving offered by using a lower voltage.

In the context of embedded ANN systems, the bulk of the on-chip memory for the ANN system may be needed to store kernel data, intermediate partial sums, and feature data, which are relatively fault tolerant, while a smaller portion may be needed to store configuration/layer sequence data, which are less fault tolerant. Similarly, host system processes may be less fault tolerant. Thus, tagging memory based the fault tolerance of the memory at various operating voltage levels may facilitate significantly increasing the yield of the chip fabrication process. In addition, the amount of memory needed for redundancy may be reduced, because rows and columns which conventionally may have been designated as unusable and replaced by redundant memory may instead be designated for operation at different voltage levels in different circumstances, reducing the need for redundant memory. Minimum operating voltages also may be reduced for significant portions of the memory, facilitating reduced usage of power in, for example, mobile devices.

The operation of certain aspects of the disclosure will now be described with respect to FIGS. 4-6. In various embodiments, processes 400, 500, and 600 described in conjunction with FIGS. 4-6, respectively, may be implemented by one or more components or circuits associated with a memory compute elements, as described herein.

Figure 4:
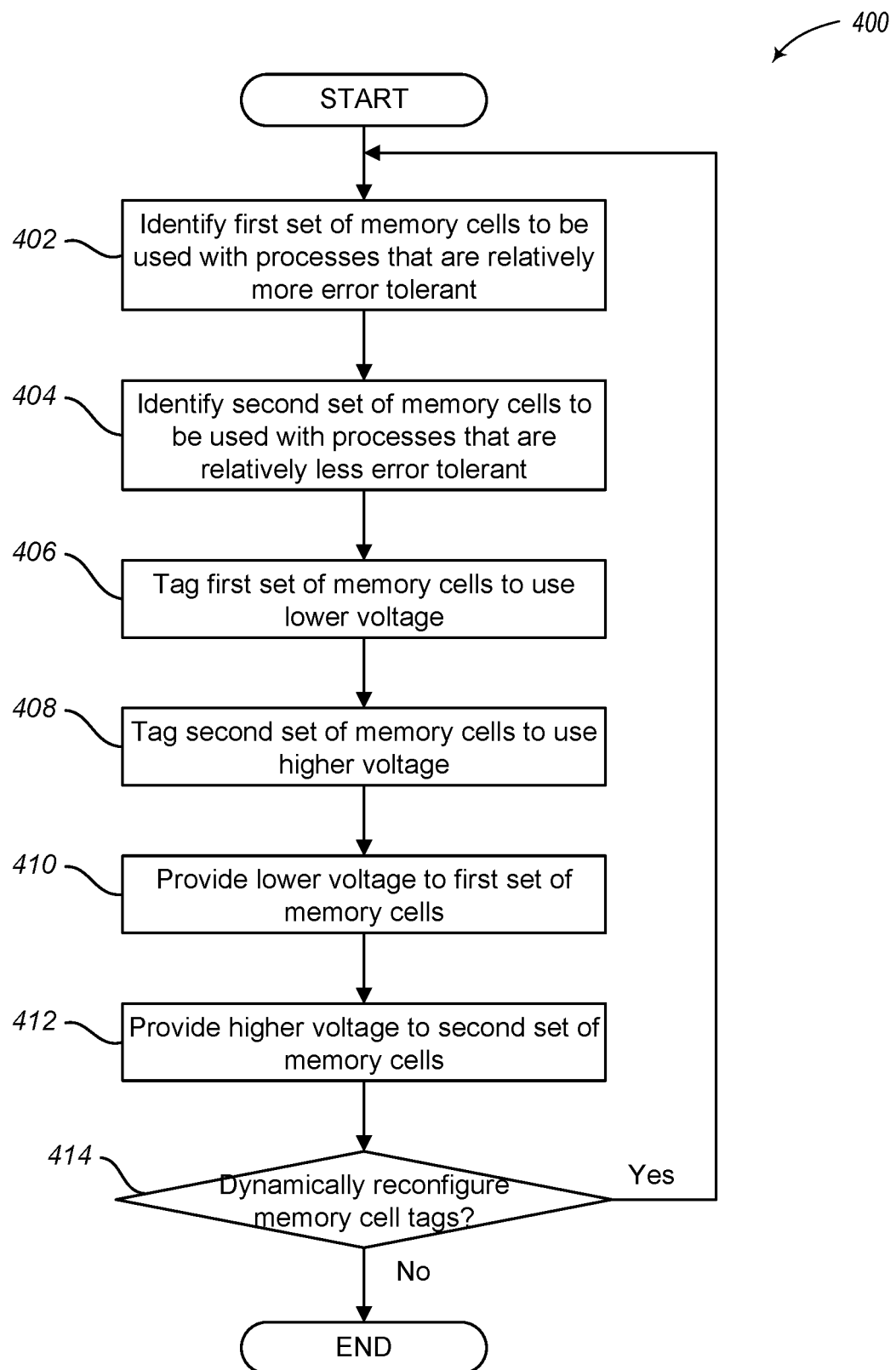
FIG. 4 illustrates a logical flow diagram generally showing one embodiment of a process for tagging a first set of memory cells as low-voltage and a second set of memory cells as high voltage.

FIG. 4 illustrates a logical flow diagram generally showing one embodiment of a process 400 for tagging a first set of memory cells as being operated in a low-voltage mode and a second set of memory cells as being operated in a high voltage. Process 400 begins, after a start block, at block 402, where a first set of memory cells are identified to be used with one or more processes that are relatively more error tolerant. Processes that are relatively more error tolerant are those processes that can operate within a defined threshold of reliability or accuracy when a number or percent of incorrect memory bit values is above a threshold value.

Process 400 proceeds to block 404, where a second set of memory cells are identified to be used with one or more processes that are relatively less error tolerant. Processes that are relatively less error tolerant are those processes that operate within a defined threshold of reliability or accuracy when a number or percent of incorrect memory bit values is below the threshold value.

As mentioned herein, the memory cells may be identified to be used with more error tolerant or less error tolerant processes based on the type of data that is to be stored in the memory cells.

In some embodiments, the tolerance identification is set by a user or administrator or may be dynamically determined based on the current data processing being performed by the system. For example, during the processing of a first layer in an artificial neural network, an administrator may set or the system may determine that the amount of data to be used with more error tolerant processes is 60 percent of the total available memory. But for a second layer in the artificial neural network, the administrator may set or the system may determine that the amount of data to be used with more error tolerant processes is 90 percent of the total available memory.

Process 400 continues at block 406, where the first set of memory cells is tagged to use lower voltage. Process 400 proceeds next to block 408, where the second set of memory cells are tagged to use higher voltage. In various embodiments, a database or particular memory cells are updated to store the corresponding tag value based on the tolerance identification.

Process 400 continues next at block 410, where a lower voltage is provided to the first set of memory cells. Process 400 proceeds to block 412, where a high voltage is provided to the second set of memory cells. In various embodiments, circuitry may be utilized to select or reduce the power to the memory cells based on the tagging of the cells. For example, a high-voltage power supply may be selected to provide the high voltage to the second set of memory cells. Conversely, a low-voltage power supply (or a reduced voltage from the high-voltage power supply) may be selected to provide the low voltage to the first set of memory cells.

Process 400 continues at decision block 414, where a determination is made whether to dynamically reconfigure the memory the memory cell tags. In various embodiments, this determination may be set or selected by an administrator, a user, or based on the type of processing being performed by the system. For example, if an artificial neural network utilizes seven processing layers, each separate layer may be tolerant of a different amount of errors. The memory cell tagging can be dynamically reconfigured between the processing of different layers.

As another example, during a first operation, a user may indicate that the artificial neural network is to operate at a first effectiveness level (e.g., to correctly identify a face 40% of the time or indicate that there is a 40% chance of an image containing a face). During this first operation, a higher amount of the memory may be utilized in a low-voltage mode. But if during a second operation, the user indicates that the artificial neural network is to operate at a second, higher effectiveness level (e.g., to correctly identify a face 80% of the time or indicate that there is a 80% chance of an image containing a face), then the tagging may be reconfigured such that the data is processed using memory set in high-voltage mode. In this scenario, the system can tolerate more errors during the first operation than the second operation.

One example implementation where this functionality may be used is when images are first analyzed to determine if there is some likelihood of the images containing a target feature, e.g., a face. For those images where that likelihood is above a selected threshold value, then those images may be reanalyzed to more accurately determine if those images do contain the target feature. Thus, the images may be first analyzed using the majority of the memory in low-voltage mode, and reprocessing the images that satisfy the initial threshold using the memory in high-voltage mode.

In another example implementation, the voltage may be adjusted from high-voltage mode to low voltage mode to reduce power consumption, which extends battery life in exchange for reduced accuracy of the artificial neural network. In some embodiments, a built-in-self-test may be run to determine how low the voltage may be reduced before the number of errors exceeds a threshold amount or the neural network accuracy drops below a threshold amount.

If the memory cells tags are to be reconfigured, process 400 loops to block 402; otherwise, process 400 terminates or otherwise returns to a calling process to perform other actions.

Figure 5:
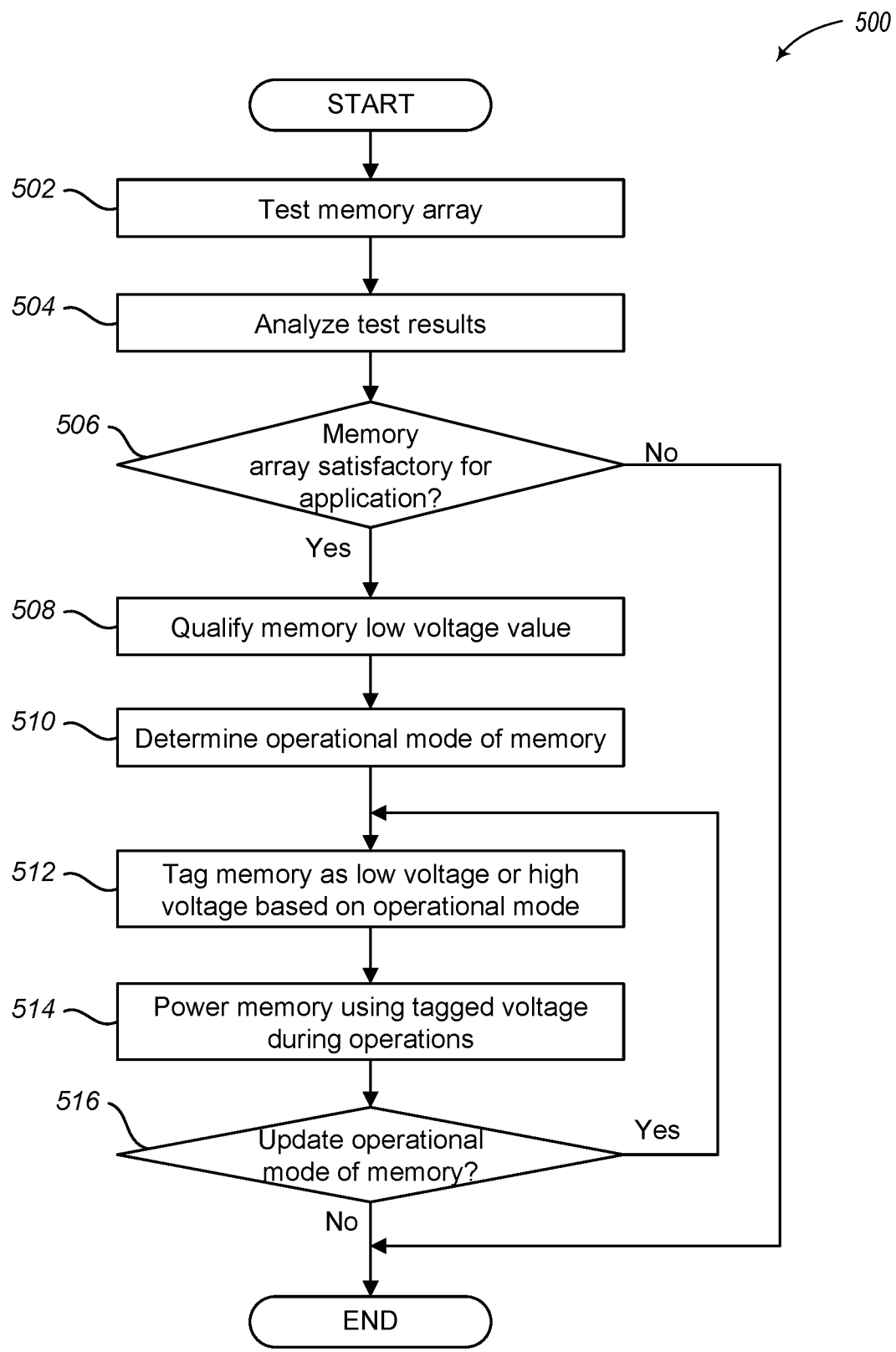
FIG. 5 illustrates a logical flow diagram generally showing another embodiment of a process for tagging memory cells as low voltage or high voltage based on a quality test of the memory array.

FIG. 5 illustrates a logical flow diagram generally showing another embodiment of a process 500 for tagging memory cells to be operated as low voltage or high voltage based on a quality test of the memory array. Process 500 begins, after a start block, at block 502, where a memory array is tested. Various types of testing methodologies may be employed to test the memory during the manufacturing stage or thereafter, such as by testing a wafer containing a plurality of memory arrays to determine a number of errors by each memory array.

Process 500 proceeds to block 504, where the test results are analyzed. In various embodiments, the test results are analyzed to determine the number of errors produced by an entire memory array or a portion of the memory array. The number of errors can be compared against one or more thresholds to classify the memory array. Statistical analysis may be performed. The testing may be performed at various operating voltage levels.

For example, if a memory array achieves a first threshold number of errors, then the memory array may be classified as Grade_A. If a memory array does not achieve the first threshold number of errors but does achieve a second threshold number of errors, then the memory array may be classified as Grade_B. Any memory arrays that do not achieve the second threshold may be classified as bad and discarded. Grade_A memory arrays may be memory arrays that can be used in systems or processes where errors cannot be tolerated, similar to data processed by high-voltage memory cells. Grade_B memory arrays may be memory arrays that can be used in systems or processes where some errors can be tolerated, similar to data processed by low-voltage memory cells.

Process 500 continues at decision block 506, where a determination is made whether the memory array is satisfactory for a particular application. For example, if the application of the memory array is to store configuration data, then the memory array would have to be classified as Grade_A, using the example above. But if the application of the memory array is to store kernel data, then the memory array could be classified as either Grade_A or Grade_B. If the memory array is not satisfactory for the application, then that memory array may be discarded and process 500 ends; otherwise, process 500 flows to block 508.

At block 508, the low voltage value of the memory array is qualified. In various embodiments, the memory array is qualified using known techniques for a single or set of low voltages, Vmin. For example, a voltage sufficient to provide a desired statistical accuracy level may be selected based on the analysis at 504. Voltage scaling or frequency scaling can also be performed.

Process 500 proceeds next to block 510, where an operational mode of the memory array is determined. The operation mode may be based on a desired accuracy of the processing performed using data stored in the memory array. For example, a first operational mode may be a low-power state or a qualification state and a second operational mode may be a high-power state or verification state. In this example, the neural network may process images using most of the memory in a low-voltage mode (first operational mode) to determine if an event of interest is present in the images, e.g., the presence of a face. If the processing indicates that an image is likely to have the event of interest, then the neural network may process those particular images using the memory in a high-voltage mode (second operational mode). In this way, the second processing confirms or verifies if the image includes the event of interest.

Process 500 continues next at block 512, where the memory is tagged as low voltage or high voltage based on the operational mode. In some embodiments, the entire memory array may be tagged as low voltage or high voltage based on the operational mode. In other embodiments, a first portion of the memory array is tagged as low voltage and a second portion of the memory array is tagged as high voltage. Tagging may be performed as discussed herein.

Process 500 proceeds to block 514, where the memory is powered using the tagged voltage during operations. In various embodiments, the low voltage supplied to the low-voltage memory cells may be a voltage that is lower than the qualified low voltage value, but within a selected amount or threshold. The high voltage supplied to the high-voltage memory cells is at or above the qualified low voltage value.

Process 500 continues to block 516, where a determination is made whether the operational mode of the memory has changed or been updated. The operational mode may change from the processing of one set of data to another set of data (e.g., from one image to another) or processing the data in a different manner (e.g., from one neural network processing layer to another). If the operational mode has been updated or changed, process 500 loops to block 512, to retag the memory based on the updated operational mode; otherwise, process 500 terminates.

Although not illustrated, the memory low voltage value may be requalified after a select period of time or a select amount of utilization. If the memory low voltage value is to be requalified, then process 500 loops to block 508. Moreover, as discussed above, the individual memory arrays or the portions of the memory arrays may not be tagged. Rather, particular memory arrays may be used as low-voltage memory or as high-voltage memory depending on the qualified memory low voltage value determined at block 508 or the test results determined at block 504. Again, in this type of system, there are no tags—rather, the voltage supplied to the memory arrays is static such that one memory array operates at a lower voltage than the other. In another example, the memory array may periodically be retested or retested in response to a triggering event (e.g., restarting of the system). In such a case, the method 500 may loop to block 502.

Embodiments of the foregoing processes and methods may contain additional acts not shown in FIGS. 4-5, may not contain all of the acts shown in FIGS. 4-5, may perform acts shown in FIGS. 4-5 in various orders, may combine acts, and may be modified in various respects. For example, process 400 in FIG. 4 may omit act 414 such that the memory tagging is only performed once, process 400 may combine acts 402 and 404, process 400 may combine acts 406 and 408, process 400 may perform acts 410 and 412 in parallel, etc.

In some embodiments, error correction coding (ECC) may be selectively implemented based on the tag values of a memory cell or region. For example, a first memory region tagged as associated with more fault tolerant processes may be operated at a low voltage level with ECC coding when the first region is used to store data for a first process, while a second memory region tagged as associated with less fault tolerant processes may be operated at a high voltage level without ECC coding when the second region is used to store data for the first process.

Although embodiments described above are discussed with respect to the operation of memory cells in a low-voltage mode or in a high-voltage mode, embodiments are not so limited. Rather, in some embodiments, some or all memory cells may be operated in a dynamic voltage mode such that their operating voltage can be selected or modified based on a target or selected accuracy threshold. The accuracy threshold corresponds to a statistical correlation between the operational voltage of the memory and an operational accuracy of the memory. In various embodiments, operation of the memory at a lower operational voltage statistically correlates to a lower operational accuracy of the memory (e.g., a higher number of faults or errors). Conversely, operation of the memory at higher operational voltage statistically correlates to a higher operational accuracy of the memory (e.g., a lower number of faults or errors). In this way, the accuracy of the system can be a tradeoff for lowering the operational voltage of the memory (e.g., to reduce power consumption).

In some embodiments, the operational accuracy may be based on a system operational accuracy of operations performed using the data stored in the memory. In at least one embodiment, the system operational accuracy may indicate a confidence value or probability threshold when performing certain operations in an artificial neural network. For example, an administrator may set or the system may determine that the artificial neural network positively identify objects at a 70% confidence level (e.g., it is at least 70% likely that an image includes a face). In other embodiments, the operational accuracy may be based on a statistical accuracy for a number of sense amplifier marginality faults in the memory cells. For example, an administrator may set or the system may determine that the percentage (or number) of hard faults/errors of the memory bit cell or sense amplifier be less than a one percent.

In various embodiments, the dynamic voltage mode can be modified to change the operational voltage of the memory cells between different types of operations (e.g., when processing different layers in an artificial neural network), in response to user selection, in response to system operation (e.g., when entering a low power mode), or otherwise during operation, or some combination thereof. In some embodiments, a first set of memory cells may operate in the dynamic voltage mode while a second set of memory cells operate in a second voltage mode independent of the dynamic voltage mode.

Memory cells that utilize the dynamic voltage mode can be tagged similar to what is described above. For example, a memory management circuitry (e.g., memory voltage management circuitry 160 in FIG. 1) may tag a first set of memory cells to be operated in a dynamic voltage mode with an associated operational voltage by storing a first value in a first memory associated with the first set of memory cells. In other embodiments, the memory management circuitry may tag a first set of a plurality of memory cells as associated with a first operational mode (e.g., the dynamic operational mode) and tag a second set of the plurality of memory cells as associated with a second operational mode. The power control circuitry provides a first operational voltage to the first set of memory cells and provides a second operational voltage to the second set of memory cells based on the tags. In some embodiments, a voltage selection circuit can select a low-voltage power supply to provide the first operational voltage to the first set of memory cells based on the tag to the first set of memory cells and select a high-voltage power supply to provide the second operational voltage to the second set of memory cells based on the tag to the second set of memory cells.

Figure 6:
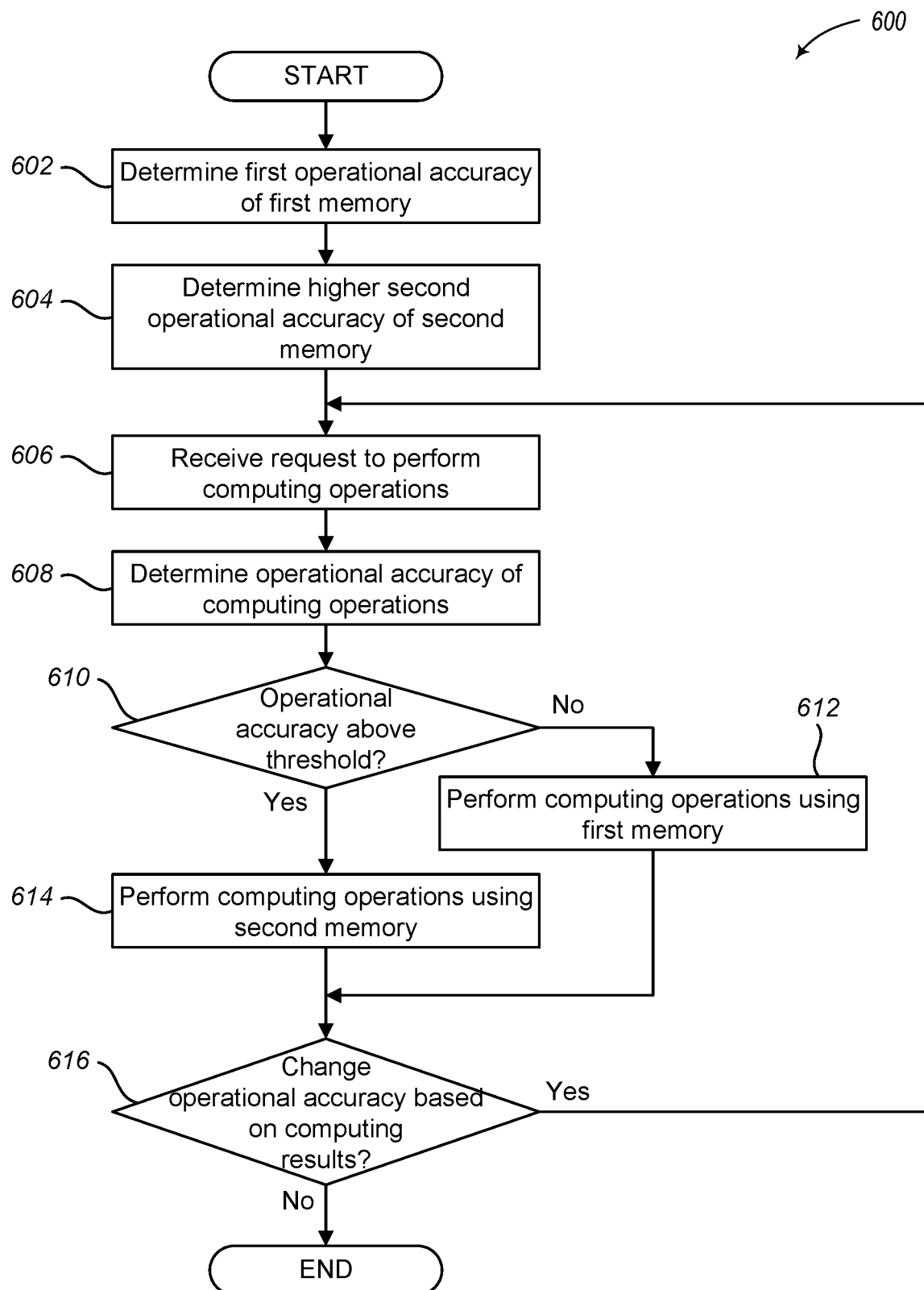
FIG. 6 illustrates a logical flow diagram generally showing one embodiment of a process for employing separate memory cells at different voltage levels based on an operational accuracy of the memory cells.

FIG. 6 illustrates a logical flow diagram generally showing one embodiment of a process for employing separate memory cells at different voltage levels based on an operational accuracy of the memory cells. Process 600 begins, after a start block, at block 602, where a first operational accuracy of a first plurality of memory cells is determined. In some embodiments, this determination is made during quality testing of the memory. In other embodiments, the first plurality of memory cells may be tagged with the first operational accuracy, similar to what is described above for tagging memory cells for a lower operational voltage.

Process 600 proceeds to block 604, where a second operational accuracy of a second plurality of memory cells is determined. In various embodiments, block 604 employs embodiments of block 602 to determine the operational accuracy, but with a different set of memory cells. In various embodiments, the second operational accuracy is higher than the first operational accuracy. An operational accuracy that is higher than another operational accuracy may be based on a statistical probability of fewer errors or faults in the memory, which may affect the accuracy of the computing operations being performed that use the memory. For example, a high operational accuracy may be one where the memory performs with 0-0.01% bit errors, whereas a low operational accuracy may be one where the memory performs with 1% bit errors. In some situations, lowering the voltage for a first voltage where 0-0.01% bit errors occur to a second voltage where 1% bit errors occur can result in power savings of up to 30%.

In some embodiments, the first and second plurality of memory cells are part of a same memory array. In other embodiments, the first and second plurality of memory cells are part of separate memory arrays.

Process 600 continues at block 606, where a request to perform computing operations is received. In various embodiments, this request is to perform some type of computational operations, such as host processing, a particular type of artificial neural network operations (e.g., different processing layers of an artificial neural network), threshold accuracy of classification, type of classification, etc. As one non-limiting example, a first request may be to perform simple classification of images during an "always on" mode (e.g., image may contain a human). As another example, a second request may be to perform complex classification of images during a "wake up" mode (e.g., image contains an adult male human). Other types of requests to perform computing operations using the first or second memory may also be received.

Process 600 proceeds next to block 608, where an operational accuracy of computing operations is determined. In some embodiments, an operation type of the computing operations is determined, which is associated with an operational accuracy. For example, using the example above, one operation type may be simple classification and another operation type may be complex classification. The simple classification may be associated with a low operational accuracy and the complex classification may be associated with a high operational accuracy.

Process 600 continues next at decision block 610, where a determination is made whether the determined operational accuracy is above a threshold value. In some embodiments, this threshold may be set by an administrator or user. In other embodiments, the threshold is set as a binary operation based on the operation type of computing operations that can be performed (e.g., the threshold is not met if computing operations are to perform simple classification and threshold is met if the computing operations are to perform complex classification). If the operational accuracy is above the threshold (or the operation type is to utilize higher accuracy memory), then process 600 flows to block 614; otherwise, process 600 flows to block 612.

At block 612, the computing operations for the request are performed using the first plurality of memory cells. In some embodiments, the first plurality of memory cells are operated at a lower operational voltage than the second plurality of memory cells. After block 612, process 600 continues at decision block 616.

If, at decision block 610, the determined operational accuracy is above the threshold, then process 600 flows from decision block 610 to block 614. At block 614, the computing operations for the request are performed using the second plurality of memory cells. In some embodiments, the second plurality of memory cells are operated at a higher operational voltage than the first plurality of memory cells.

Process 600 then proceeds to decision bloc 616, where a determination is made whether to change the operational accuracy based on computing results of performing the computing operations. In various embodiments, the computing operations may be performed at block 612 using the first memory at a lower operational voltage to perform a simple artificial neural network classification on a set of data. If a result of the classification is a positive identification (e.g., a confidence level above a threshold value that there is a positive identification of a trained object), then the system may reanalyze the set of data using a complex artificial neural network. In this example, the computing operations would then be performed using the second memory at a higher operational voltage.

If a change in the operational accuracy is determined based on the computing results, then process 600 returns to block 606 to receive a new or updated request to perform computing operations; otherwise, process 600 terminates or otherwise returns to a calling process to perform other actions.

Although process 600 describes two memories being used for computing operations at two different operational accuracies, embodiments are not limited to the two memories being separate or distinct memories. Rather, in some embodiments, a single plurality of memory cells are utilized for one or more processes or computing operations that are to operate at different accuracies.

For example, in some embodiments a process may be executing using a plurality of memory cells to store data at a first operational accuracy. During the processing, an event may be detected, which triggers a change in the operational accuracy from the first operational accuracy to a second operational accuracy that is higher than the first operational accuracy. The process may continue to execute using the plurality of memory cells, but at the higher, second operational accuracy.

In some embodiments, the process may be initially executing with the plurality of memory cells operating at a first operational voltage, which provides a first operational accuracy of the process. For example, the process may be to analyze images for humans using a simple artificial neural network classifier. If the process detects a human (e.g., detects an event), then the operational voltage of the plurality of memory cells may be increased to a second operational voltage that is higher than the first operational voltage. The process can then continue to process the images at a second operational accuracy that is higher than the first operational accuracy, which allows the process to be more accurate or to perform more complex artificial neural network classifiers (e.g., to identify particular people or faces).

In other embodiments, rather than increasing the voltage of the memory to increase the operational accuracy of the process, other actions may be performed. For example, the other actions may include selecting other memory that is operating at a higher voltage, selecting other memory that has a higher operational accuracy, changing the neural network classifier or algorithm being used, increasing a speed of the processor, initiating a separate process that executes at a higher operational accuracy, etc.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a plurality of memory cells arranged as a plurality of rows of memory cells intersecting a plurality of columns of memory cells, which, in operation, store data;
memory management circuitry coupled to the plurality of memory cells, wherein the memory management circuitry, in operation, tags a first set of the plurality of memory cells as associated with a first operational mode and tags a second set of the plurality of memory cells as associated with a second operational mode; and
power control circuitry, coupled to the memory management circuitry and the plurality of memory cells, wherein the power control circuitry, in operation and based on the tags, provides a first operational voltage to the first set of memory cells and provides a second operational voltage to the second set of memory cells, wherein the first operational voltage is different from the second operational voltage, wherein the first set of memory cells includes:
a subset of columns in the plurality of columns of memory cells,
a subset of rows in the plurality of rows of memory cells, or
both a subset of columns in the plurality of columns of memory cells and a subset of rows in the plurality of rows of memory cells.

2. The system of claim 1, wherein the memory management circuitry identifies the first set of memory cells as memory cells that have a statistical probability of errors at the first operational voltage which is below a first threshold level.

3. The system of claim 2, wherein the first threshold level corresponds to one percent bit cell sense amplifier marginality faults in the plurality of memory cells.

4. The system of claim 2, wherein the memory management circuitry identifies the second set of memory cells as memory cells that have a statistical probability of errors at the second operational voltage which is below a second threshold level, the second threshold level being lower than the first threshold level.

5. The system of claim 1, wherein the memory management circuitry, in operation, tags the first set of memory cells by storing a first value in a first memory associated with the first set of memory cells.

6. The system of claim 1, wherein the first set of memory cells includes a subset of columns in the plurality of columns of memory cells.

7. The system of claim 6, wherein the memory management circuitry, in operation, tags the first set of memory cells by storing a value in each of the subset of columns.

8. The system of claim 6, wherein the memory management circuitry, in operation, tags the first set of memory cells by storing a value in a memory associated with a plurality of the subset of columns.

9. The system of claim 1, wherein the first set of memory cells includes a subset of rows in the plurality of rows of memory cells.

10. The system of claim 9, wherein the memory management circuitry tags the first set of memory cells by storing a value in each of the subset of rows.

11. The system of claim 9, wherein the memory management circuitry tags the first set of memory cells by storing a value in a memory associated with a plurality of the subset of rows.

12. The system of claim 6, wherein the memory management circuitry, in operation, tags the memory cells by storing a table of memory cell addresses and corresponding tags.

13. The system of claim 1, wherein the power control circuitry includes a low-voltage power supply and a high-voltage power supply.

14. The system of claim 13, comprising:
a voltage selection circuit that, in operation, selects the low-voltage power supply to provide the first operational voltage to the first set of memory cells based on the tag to the first set of memory cells and selects the high-voltage power supply to provide the second operational voltage to the second set of memory cells based on the tag to the second set of memory cells.

15. The system of claim 1, wherein the memory management circuitry, in operation, selectively implements error correction coding based on tag values.

16. A method, comprising:
tagging a first set of a plurality of memory cells as associated with a first operational mode based on a statistical error rate associated with the first set of memory cells, wherein the plurality of memory cells are arranged as a plurality of rows of memory cells intersecting a plurality of columns of memory cells;
tagging a second set of the plurality of memory cells as associated with a second operational mode based on a statistical error rate associated with the second set of memory cells;
providing a first operational voltage to the first set of memory cells based on the tagging; and
providing a second operational voltage to the second set of memory cells based on the tagging, wherein the second operational voltage is different from the first operational voltage and the first set of memory cells includes:
a subset of columns in the plurality of columns of memory cells,
a subset of rows in the plurality of rows of memory cells, or
both a subset of columns in the plurality of columns of memory cells and a subset of rows in the plurality of rows of memory cells.

17. The method of claim 16, comprising:
providing the first operational voltage to the first set of memory cells for use by at least one first process based on the tagging of the first set of memory cells; and
providing the second operational voltage to the second set of memory cells for use by at least one second process based on the tagging of the second set of memory cells.

18. The method of claim 17, comprising:
receiving a request to modify the tagging of the first set of memory cells;
tagging a first portion of the first set of memory cells as associated with the first operational mode; and
tagging a second portion of the first set of memory cells as associated with the second operational mode.

19. The method of claim 16, wherein the first set of memory cells includes a larger portion of the plurality of memory cells and the second set of memory cells includes a smaller portion of the plurality of memory cells.

20. The method of claim 16, wherein the tagging the first set of memory cells comprises storing a first value in a first memory associated with the first set of memory cells.

21. A non-transitory computer-readable medium having contents that cause a processor to perform actions, the actions comprising:

determining a first set of a plurality of memory cells as associated with a first operational mode based on a first statistical error rate, wherein the plurality of memory cells are arranged as a plurality of rows of cells intersecting a plurality of columns of cells and the first set of memory cells includes a subset of columns in the plurality of columns of cells, a subset of rows in the plurality of rows of cells, or both a subset of columns in the plurality of columns of cells and a subset of rows in the plurality of rows of cells;
storing a first tag associated with the first set of memory cells;
determining a second set of the plurality of memory cells as associated with a second operational mode based on a second statistical error rate;
storing a second tag associated with the second set of memory cells;
selecting a first power source to supply a first operational voltage to the first set of memory cells based on the first tag associated with the first set of memory cells; and
selecting a second power source to supply a second operational voltage to the second set of memory cells based on the second tag associated with the second set of memory cells, wherein the first operational voltage is above a minimum threshold and less than the second operational voltage.

22. The non-transitory computer-readable medium of claim 21, wherein selecting the first power source to supply the first operational voltage to the first set of memory cells includes:
reducing the second operational voltage from the second power source to the first operational voltage.

23. The non-transitory computer-readable medium of claim 21, wherein the contents comprise instructions executed by the processor.

24. A device, comprising:
a plurality of memory cells arranged as a plurality of rows of memory cells intersecting a plurality of columns of memory cells, which, in operation, store data;
memory management circuitry coupled to the plurality of memory cells, wherein the memory management circuitry in operation:
tags a first set of the plurality of memory cells as associated with a first operational mode and tags a second set of the plurality of memory cells as associated with a second operational mode; and
controls providing of a first operational voltage to the first set of memory cells and providing of a second operational voltage to the second set of memory cells, wherein the first operational voltage is different from the second operational voltage, wherein the first set of memory cells includes:
a subset of columns in the plurality of columns of memory cells,
a subset of rows in the plurality of rows of memory cells, or
both a subset of columns in the plurality of columns of memory cells and a subset of rows in the plurality of rows of memory cells.

25. The device of claim 24, wherein the memory management circuitry identifies the first set of memory cells as memory cells that have a statistical probability of errors at the first operational voltage which is below a first threshold level.

26. The device of claim 24, wherein the memory management circuitry, in operation, tags the memory cells by storing a table of memory cell addresses and corresponding tags.

* * * * *